United States Patent [19]

Ingman

[11] Patent Number: 4,999,594
[45] Date of Patent: Mar. 12, 1991

[54] AC LINE FILTER WITH TAPPED BALUN WINDING

[75] Inventor: Thomas M. Ingman, Somis, Calif.
[73] Assignee: Condor, Inc., Oxnard, Calif.
[21] Appl. No.: 282,071
[22] Filed: Dec. 9, 1988
[51] Int. Cl.⁵ .............................................. H03H 7/09
[52] U.S. Cl. ......................................... 333/181; 333/25
[58] Field of Search ............................. 333/181, 25, 12
[56] References Cited

U.S. PATENT DOCUMENTS

| | | | |
|---|---|---|---|
| 1,866,525 | 7/1932 | Carter | 333/25 X |
| 2,758,219 | 8/1956 | Miller | 333/25 X |
| 2,939,095 | 5/1960 | Chertok | 333/167 |
| 3,356,901 | 12/1967 | Kramer et al. | 361/58 |
| 3,546,572 | 12/1970 | Specht et al. | 361/111 |
| 3,571,658 | 3/1971 | Knoth | 361/35 |
| 4,259,705 | 3/1981 | Stifter | 361/56 |
| 4,616,286 | 10/1986 | Breece | 361/56 |
| 4,698,721 | 10/1987 | Warren | 361/110 |

FOREIGN PATENT DOCUMENTS 1007762  5/1952  France .......................... 333/181

Primary Examiner—Benny Lee
Attorney, Agent, or Firm—David B. Newman, Jr.

[57] ABSTRACT

An AC line filter having a balun coupled to an AC voltage input and an AC voltage output. The balun includes a first and a second set of windings with a first and a second tap on the first and second set of windings, respectively. A first Y capacitor is connected to a ground and the first tap of the first set of windings of the balun, and a second Y capacitor is connected to the ground and a second tap of the second set of windings of the balun.

31 Claims, 4 Drawing Sheets

AC LINE FILTER WITH TAPPED BALUN WINDING

BACKGROUND OF THE INVENTION

This invention relates to AC line filters, and more particularly to an AC line filter having reduced electromagnetic interference characteristics and low insertion loss.

DESCRIPTION OF THE PRIOR ART

At present, there are very few AC line filters available which have low conducted electromagnetic interference (EMI) and low leakage characteristics. AC line filters having low conducted EMI and low leakage characteristics find application in switching/linear power supplies, and particularly for international medical applications. Such filters are used at the AC input to a switching/linear power supply to reduce the conducted interference generated by the rectifiers and/or switching transistors.

Linear power supplies find application in the medical field because power transformers have inherently low leakage, meeting a low leakage requirement. Low power linear power supplies typically pass the EMI specifications. High power linear power supplies often do not pass the EMI specification that is required for international medical applications. This is because the diodes in the rectifier circuit cause EMI, typically in the range of 100 kHz to 3 MHz.

Switching power supplies typically are not used in medical applications even though many of them can pass the EMI specifications due to built in AC line filters. The built in filters have high leakage currents and as a result the switching power supply cannot pass the leakage current specifications.

Referring to FIG. 1, a prior art AC line filter for reducing EMI is shown with a balun L10 having a first and second set of windings. The balun L10 is connected to an AC voltage input through input inductor L100, and to an AC voltage output. A first X capacitor C11 and a first resistor R11 are connected across the AC voltage input and also are connected across the input of the balun L10. A second X capacitor C14 and a second resistor R14 are connected across the AC voltage output and also are connected across the output of the balun L10. A first Y capacitor C12 is connected to the first set of windings at the output of the balun L10 and to ground. A second Y capacitor C13 is connected to the second set of windings at the output of the balun L10 and to ground. First and second resistors R11, R14 and input inductor L101 are optional, and they are for optimizing for differential mode noise and have minimum effect on common mode noise.

As is well known in the art, and as shown in FIG 1 and FIG. 2, X capacitors are those capacitors designed and specified for use across the AC line. Y capacitors are those capacitors designed and specified for use between an AC line and ground.

The balun, a type of inductor, commonly is used in the power supply industry. The balun has a magnetic core, with two sets of wires which are wound around the magnetic core with approximately the same number of turns. Baluns typically are used as a filter at the input to switching and linear power supplies to cancel common mode and differential mode noise. As depicted in FIG. 1, the AC current, which, for example, might be 60 cycles, flowing through each winding of balun L10 generates magnetic flux. The magnetic flux due to each winding flows in opposite directions in the magnetic core, thus approximately cancelling each other. Otherwise, large inductors would be required for the balun to support large currents without saturating the magnetic core.

Presently available AC line filters use Y capacitors C12, C13 having values between 2200–4700 picofarads. The Y capacitors remove common mode noise. In order to meet the low leakage requirement, the Y capacitors are either removed or reduced to a very small value, such as 100 picofarads. Removing the Y capacitors or reducing the value of the Y capacitors, however, reduces their effectiveness for removing common mode noise, increasing the EMI to an unacceptable level.

The X capacitors C11, C14 are used to remove the differential mode noise. Typical values of an X capacitor is 0.1 to 1.0 microfarads. The X capacitors C11, C14 and the leakage inductance in the balun L10 remove the differential mode noise. The problem is with the Y capacitors, on how to reduce their value to reduce leakage, and at the same time have the Y capacitors with a large enough value remove the common mode noise, and thus reduce EMI.

FIG. 2 illustrates an AC line filter that will meet the requirements of having low leakage and low EMI. The circuit of FIG. 2 has a first balun L10 connected in series with a second balun L20. First and second Y capacitors C12, C13 are connected across the output of the first balun L10 to ground. A first X capacitor C11 is connected across the AC voltage input and also is connected across the input to the first balun L10. A second X capacitor C15 and resistor R15 are connected across the AC voltage output and also are connected across the output of the second balun L20. The second balun L20 adds impedance to the circuit, which improves the low leakage and low EMI characteristics of the circuit. Resistor R15 is optional and it is for optimizing for differential mode noise and has minimum effect on common mode noise. A first X capacitor C11 and a first resistor R11 are connected across the AC input voltage, for optimizing for differential mode noise, as previously described for FIG. 1.

The prior art circuit of FIG. 2 works quite well; however, the filter uses two baluns L10, L20. The cost of using two baluns is expensive. FIG. 2 commonly is referred to as a two stage filter, and additional stages can be added to improve performance of low leakage and low EMI, at the cost of increased size, complexity, and expense.

OBJECTS AND SUMMARY OF THE INVENTION

An object of the present invention is to provide an AC line filter with low electromagnetic interference characteristics.

Another object of the invention is to provide an AC line filter with low insertion loss.

A further object of the invention is to provide an AC line filter that is inexpensive to manufacture and has low cost.

A still further object of the invention is to provide an AC line filter meeting the low insertion loss and EMI specifications, which is small in size.

An additional object of the invention is to provide an AC line filter that can be used with currently existing linear or switching power supplies.

According to the present invention, as embodied and broadly described herein, an AC line filter is provided comprising a balun, a first Y capacitor, and a second Y capacitor. The AC line filter connects to a ground, and has an AC voltage input and an AC voltage output. The balun is coupled to the AC voltage input and to the AC voltage output. The balun includes a first and a second set of windings, with the first set of windings having a first tap and the second set of windings having a second tap. The first Y capacitor connects to the ground and to the first tap of the first set of windings of the balun, for reducing electromagnetic interference due to common mode noise. The second Y capacitor connects to the ground and to the second tap of the second set of windings of the balun, for reducing electromagnetic interference due to common mode noise.

Additional objects and advantages of the invention will be set forth in part in the description which follows, and in part will be obvious from the description, or may be learned by practice of the invention.

BRIEF DESCRIPTION OF THE DRAWINGS

The accompanying drawings, which are incorporated in and constitute a part of this specification, illustrate a preferred embodiment of the invention, and together with the description, serve to explain the principles of the invention.

DETAILED DESCRIPTION OF THE PREFERRED EMBODIMENTS

Figure 1:
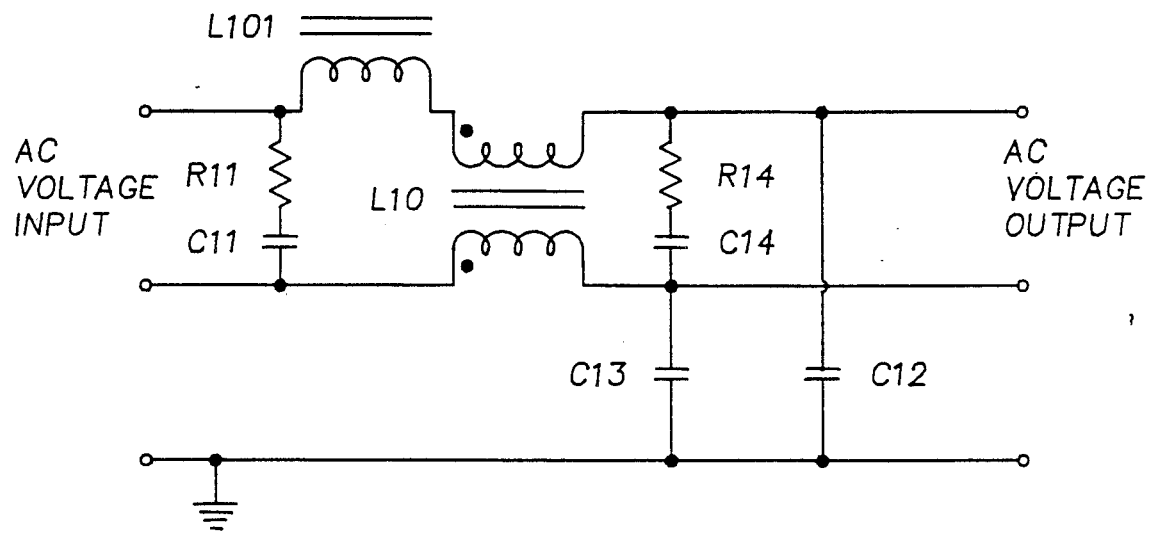
FIG. 1 is a schematic diagram of a prior art AC line filter for reducing electromagnetic interference.

Reference will now be made to the present preferred embodiments of the invention, examples of which are illustrated in the accompanying drawings, wherein like reference numerals indicate like elements throughout the several views.

Figure 3:
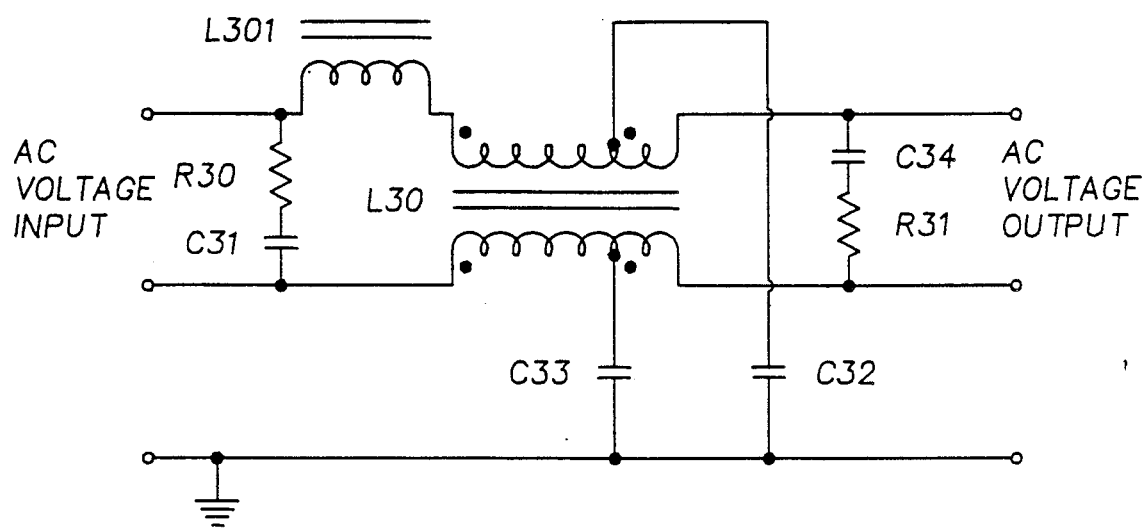
FIG. 3 is a schematic diagram of a first embodiment of an AC line filter constructed according to the present invention.

FIG. 3 illustratively shows an AC line filter comprising balun means, first X capacitance means, second X capacitance means, first Y capacitance means and second Y capacitance means. The balun means may be embodied as a balun L30 having a first set of windings with a first tap, and a second set of windings with a second tap. The balun is coupled to an AC voltage input and to an AC voltage output. The AC voltage input has a first line and a second line, and the AC voltage output has a corresponding first line and a corresponding second line. The balun L30 may be connected through an input choke L301 the first line of to the AC voltage input.

In the exemplary arrangement shown, the first and second X capacitance means may by embodied as first and second X capacitors C31, C34. The first X capacitor C31 is connected across the input of the balun L30, at the first and second lines of the AC voltage input. The second X capacitor C34 is connected across the output of balun L30, at first and second lines of the AC voltage output. A first resistor R30 may be connected to first X capacitor C31, across the input of balun L30. A second resistor R31 may be connected to second X capacitor C34, across the output of balun L30. The first and second resistors R30, R31 and input choke L301 are optional, and they are for optimizing for differential mode noise and have minimum effect on common mode noise.

The first and second Y capacitance means may be embodied as first and second Y capacitors C32, C33. The first Y capacitor C32 is connected to a ground and to the first tap of the first set of windings of the balun L30. The second Y capacitor is connected to the ground and to the second tap of the second set of windings of the balun L30.

Figure 4:
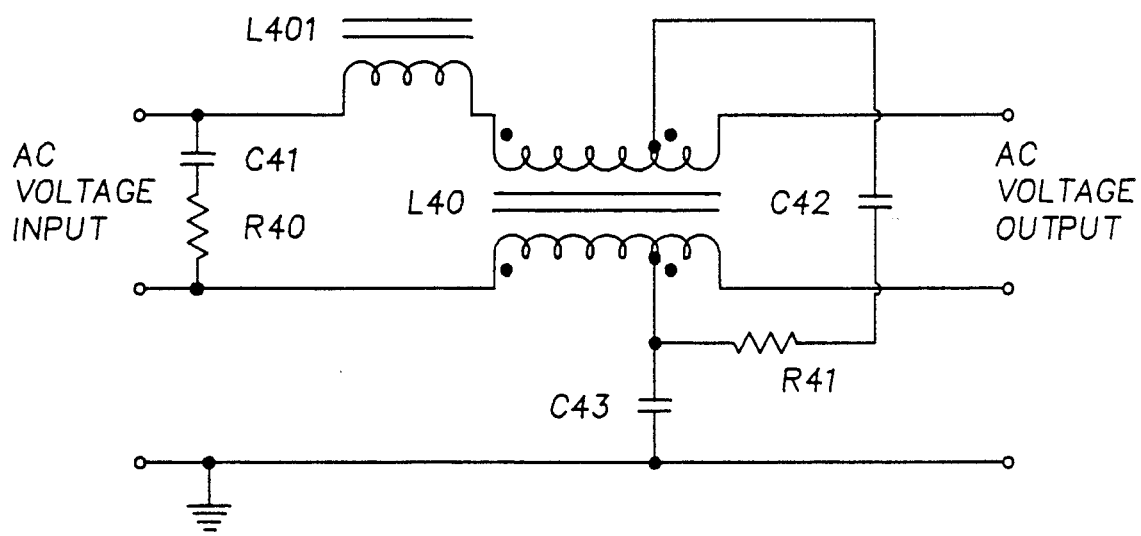
FIG. 4 is a schematic diagram of a second embodiment of an AC line filter constructed according to the present invention.

Referring to FIG. 4, a second embodiment of the present invention is shown with a balun L40 having a first set of windings with a first tap, and a second set of windings with a second tap. The balun is coupled to an AC voltage input and an AC voltage output. The balun L40 may be connected through an input choke L401 to the first line of the AC voltage input.

The second embodiment includes a first X capacitor C41 connected across the input of balun L40, at the AC voltage input. A first Y capacitor C42 is connected to the first tap of the first set of windings of balun L40, and to the second tap of the second set of windings of balun L40. A second Y capacitor C43 is connected to the second tap of the second set of windings of balun L40 and to ground. A second resistor R41 may be connected between the first Y capacitor C42 and the second tap of the second set of windings of balun L40. A first resistor R40 may be connected to first X capacitor C41, across the input of balun L40. The resistors R40, R41 and input choke L401 are optional, and they are for optimizing for differential mode noise and have minimum effect on common mode noise.

Figure 5:
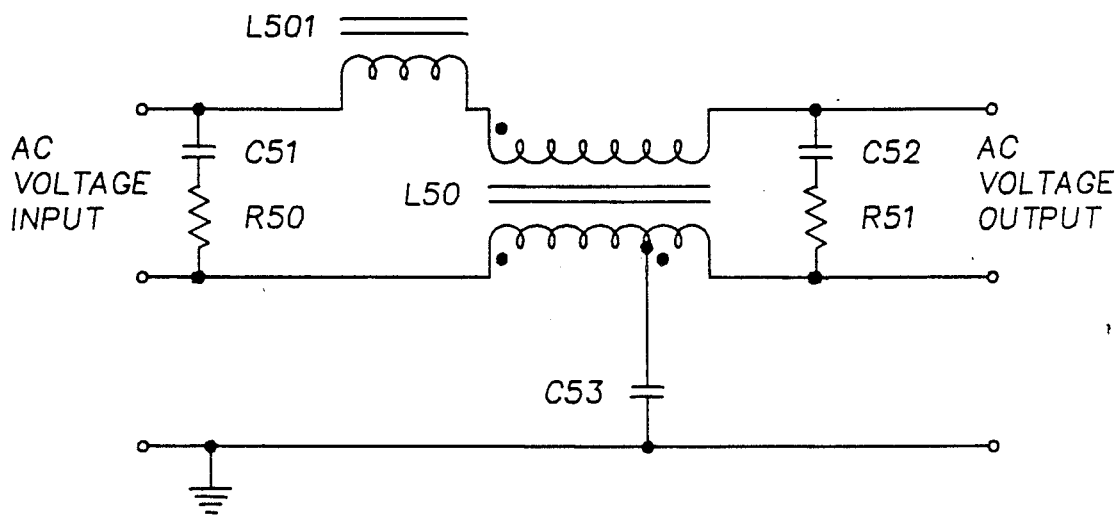
FIG. 5 is a schematic diagram of a third embodiment of an AC line filter constructed according to the present invention.

A third embodiment of the present invention is depicted in FIG. 5. In the third embodiment, a balun L50 having first set of windings and a second set of windings is shown, coupled to an AC voltage input and an AC voltage output The balun L50 may be connected through an input choke L501 to the AC voltage input. In the third embodiment, the first set of windings of the balun L50 does not have a tap, and only the second set of windings of the balun L50 has a second tap. A first X capacitor C51 is connected across the input of balun L50, at the AC voltage input. A second X capacitor C52 is connected across the output of balun L50, at the AC voltage output. A second resistor R51 may be connected between the second X capacitor C52 and the second set of windings of balun L50. A first Y capacitor C53 is connected to the second tap of the second set of windings of balun L50, and to ground. A first resistor R50 may be connected between first X capacitor C51, across the input of balun L50. The first and second resistors R50, R51 and input choke L501 are optional, and they are for optimizing for differential mode noise and have minimum effect on common mode noise.

Figure 6:
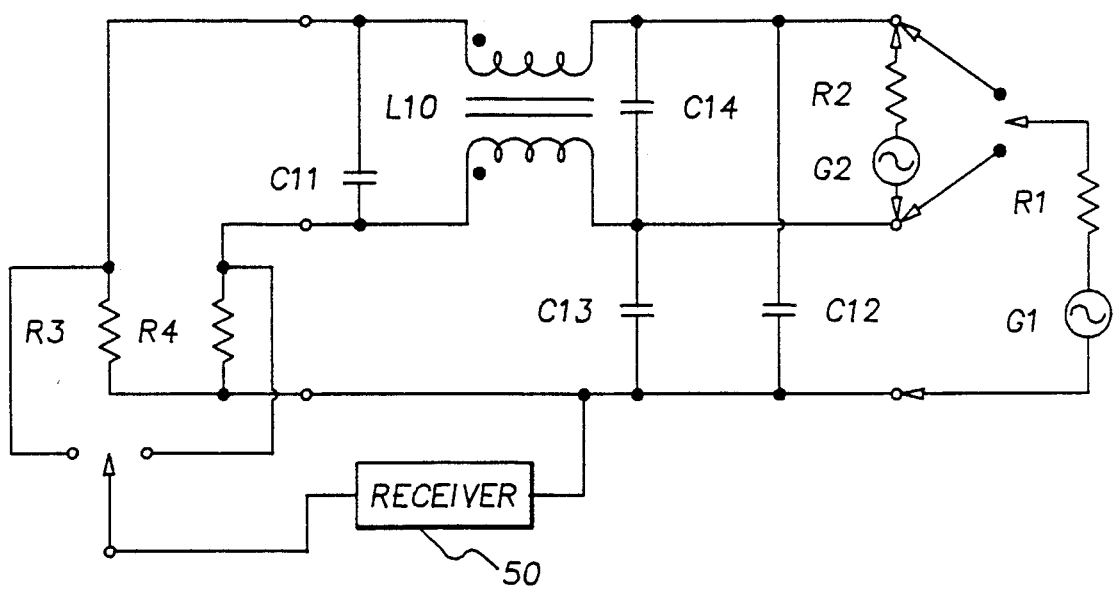
FIG. 6 is a schematic diagram of a test circuit for measuring common mode noise of the prior art AC line filter of FIG. 1.
Figure 7:
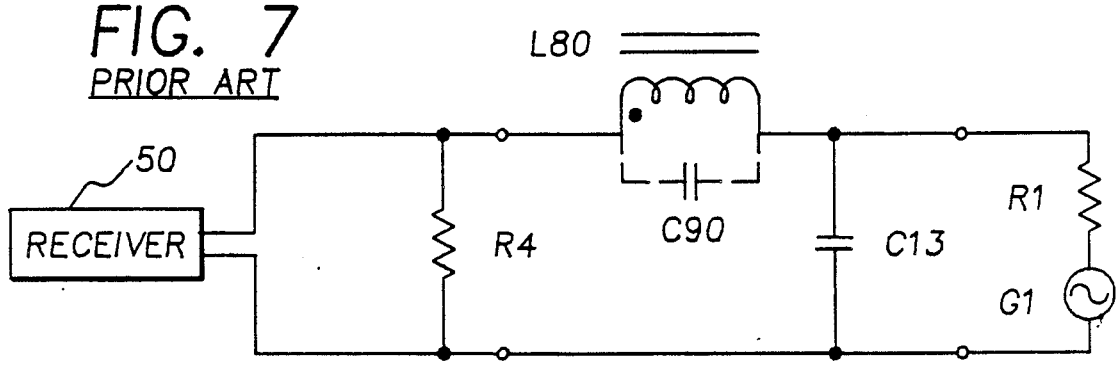
FIG. 7 is a schematic diagram of an equivalent circuit of the schematic diagrams of the present invention.
Figure 8:
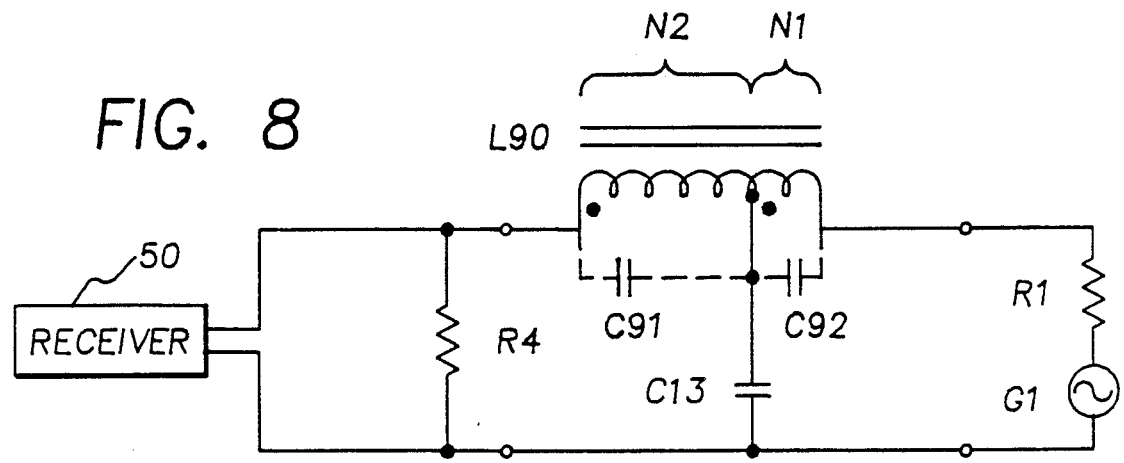
FIG. 8 is a schematic diagram of an equivalent circuit for measuring the common mode noise of the first embodiment of the AC line filter constructed according to the present invention.

To understand the operation of the present invention, reference is made to FIGS. 6–8.

Referring to FIG. 6, a circuit is shown for making noise measurements of the prior art circuit of FIG. 1. Added to the prior art circuit is a first noise generator G1 having internal resistance R1. The first noise generator G1 can be connected between either line of the AC voltage output for measuring common mode noise between one of the two lines of the AC voltage output and ground.

First and second termination resistances R3, R4, are shown connected to each line of the AC voltage input to ground, and a receiver 50 is connected between ground and either of the termination resistances R3, R4. In practice, a line stabilization network is used to make the receiver look like the termination resistance, 50 ohms. The first noise generator G1 is used for measuring the common mode noise by connecting the first noise generator G1 to one of the lines of the AC voltage output, and connecting the receiver 50 to the corresponding line of the AC voltage input.

A second noise generator G2 is shown with an internal resistance R2. The differential noise is measured by connecting the second noise generator G2 between the lines of the AC voltage output and by connecting the receiver 50 across the lines of the AC voltage input (not shown).

First and second noise generators G1, G2 generate noise similar to that found in a switching/linear power supply. First and second nose generators G1, G2 and receiver 50 are used to determine the amount of noise passing through the AC line filter.

Since the present invention is directed toward removing EMI due to common mode noise, attention is focused on first noise generator G1, and receiver 50 connected to one of the termination resistances R3, R4 of one of the lines of the AC voltage input.

An equivalent circuit for measuring the common mode noise of FIG. 6 is shown in FIG. 7. In this case, the balun L10 of FIG. 6, is shown as a choke L80, with stray capacitance C90 due to the winding capacitance of choke L80. Since the lower line of the AC voltage input and the AC voltage output was chosen, termination resistance R4 and Y capacitor C13 are shown. The objective of the choke L80 and Y capacitor C13 of FIG. 7 is to reduce the common mode noise measured at the receiver 50. This noise reduction primarily is accomplished, in the prior art, with Y capacitor C13 having a sufficiently large enough value. The Y capacitor C13, however, causes current leakage.

FIG. 8 is an equivalent circuit of the first embodiment of the present invention according to FIG. 3 for measuring the common mode noise. FIG. 8, however, is representative of all the embodiments of the present invention, for understanding its operation. In this case, the balun L30 is shown as a choke L90, having a set of windings with a tap. Y capacitor C13 is connected to the tap of choke L90 and to ground. Also shown are stray capacitances C91, C92 due to the winding capacitance of choke L90.

Instead of adding another balun which in turn adds impedance, the present invention uses a single balun shown as choke L90 which is tapped, and which adds a transformer action. As shown in FIG. 8, the first noise generator G1 can cause current to flow through the turns N1 of the choke L90 and through the Y capacitor C13. Through transformer action, the voltage across turns N1 in the choke L90 is transformed to the voltage across the turns N2 in the choke L90, in proportion to the turns ratio, N2:N1. The current flowing out of N2 flows into C91. This transformer action is similar to that of an autotransformer. The voltage across the turns N2 in the choke is approximately equal to the voltage across Y capacitor C13, thereby nulling the noise at the receiver close to zero. While a particular turns ratio N2:N1 will depend on the design of a power supply, turns ratio N2:N1 typically will be in the range of 3:1 to 10:1, and is approximately equal to the ratio of the capacitances of Y capacitor C13 to stray capacitor C91, for optimum performance.

Current flowing from the AC voltage input passes through the AC line filter of the present invention. The current flowing from the AC voltage input is not attenuated in the choke or balun of the AC line filter because the tap on the choke or balun is set for suppressing current derived from the AC voltage output, and not for suppressing current derived from the AC voltage input.

In practice, the AC line filters of the present invention as embodied in the circuits of FIGS. 3–5, operate in the same way as that described for measuring the EMI due to common mode noise, of FIG. 8.

Figure 2:
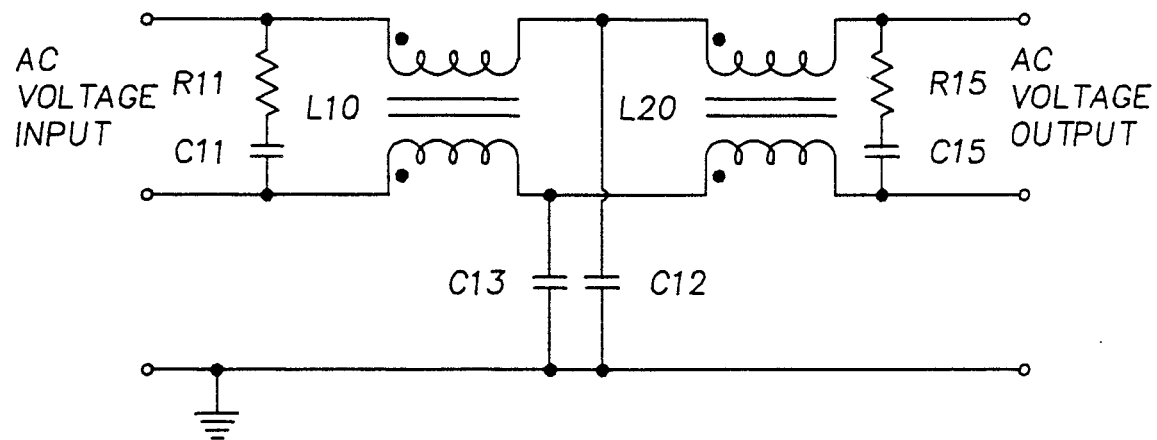
FIG. 2 is a schematic diagram of a prior art two-stage AC line filter for reducing electromagnetic interference.

The AC line filter of the present invention offers means for reducing EMI due to common mode noise by adding at least one tap to a balun and connecting a Y capacitor to the tap. The AC line filter of the present invention, which operates using a transformer action in the balun, operates different from the circuit used in the prior art as shown in FIG. 2, which requires a two stage filter. Further, the AC line filter of the present invention is less expensive the AC line filters of FIG. 2, because the present invention requires only one balun, and not two baluns. Yet, the AC line filters of the present invention reduces the EMI due to common mode noise, as required for international medical applications.

It will be apparent to those skilled in the art that various modifications can be made to the AC line filter of the instant invention without departing from the spirit or scope of the invention, and it is intended that the present invention cover modifications and variations of the AC line filter provided they come within the scope of the appended claims and their equivalents.

I claim:

1. An AC line filter connected to a ground and having an AC voltage input with a first line and a second line and an AC voltage output with a first line and a second line, comprising:

a balun having a first and a second set of windings would on a magnetic core for coupling said first set of windings to said second set of windings, with said first and second set of windings each having a first end and a second end, respectively, and each having a first and a second tap, respectively, the first end of said first set of windings coupled to the first line of the AC voltage input and the second end of said first set of windings coupled to the first line of the AC voltage output, the first end of said second set of windings coupled to the second line of the AC voltage input and the second end of said second set of windings coupled to the second line of the AC voltage output;

first Y capacitance means connected between said ground and said first tap of said first set of windings of said balun, for reducing electromagnetic interference due to common mode noise; and, second Y capacitance means connected between said ground and said second tap of said second set of windings of said balun, for reducing electromagnetic interference due to common mode nose.

2. An AC line filter connected to a ground and having an AC voltage input and an AC voltage output, comprising:

a balun having a first and a second set of winding with said first set of windings and said second set of windings wound on a magnetic core for coupling said first set of windings to said second set of windings, and said first and second set of winding having a first and second tap, respectively a first end of said first set of windings coupled to a first line of the AC voltage input and a second end of said first set of winding coupled to a first line of the AC voltage output, a first end of said second set of windings coupled to a second line of the AC voltage input and a second end of said second set of windings coupled to a second line of the AC voltage output;

a first Y capacitor connected between said ground and said first tap of said first set of windings of said balun; and, a second Y capacitor connected between said ground and said second tap of said second set of windings of said balun.

3. The AC line filter as set forth in claim 2, further comprising a first X capacitor coupled across said balun from said first set of windings to said second set of windings, at the AC voltage input.

4. The AC line filter as set forth in claim 2, further comprising a second X capacitor coupled across said balun from said first set of windings to said second set of windings, at the AC voltage output.

5. The AC line filter as set forth in claim 2, further comprising a second X capacitor connected in series with a second resistor, said second X capacitor and said second resistor connected across said balun from said first set of windings to said second set of windings, at the AC voltage output.

6. An AC line filter connected to a ground and having an AC voltage input and an AC voltage output, comprising:

a balun having a first and a second set of windings with the first set of windings having a first tap and said second set of windings having a second tap, with said first set of windings and said second set of windings wound on a magnetic core for coupling said first set of windings to said second set of windings, a first end of said first set of windings connected to a first line of the AC voltage input and a second end of said first set of windings connected to a first line of the AC voltage output, a first end of said second set of windings connected to a second line of the AC voltage input and a second end of said second set of windings connected to a second line of the AC voltage output;

a first Y capacitor connected between the first tap of said first set of windings of said balun and said second tap of said second set of windings of said balun; and, a second Y capacitor connected between said ground and said second tap of said second set of windings of said balun.

7. The AC line filter as set forth in claim 6, further comprising a first X capacitor coupled across said balun from said first set of windings to said second set of windings, at the AC voltage input.

8. The AC line filter as set forth in claim 6, further comprising:

a second resistor connected between said first Y capacitor and said second tap of said second set of windings of said balun; and a first X capacitor connected in series with a first resistor across said balun from the first end of said first set of windings to the first end of said second set of windings, at the Ac voltage input.

9. The AC line filter as set forth in claim 6, further comprising a first X capacitor connected in series with a first resistor, said first X capacitor and said first resistor connected across said balun from said first set of windings to said second set of windings, at the AC voltage input.

10. The AC line filter as set forth in claim 6, further comprising:

a second resistor connected between said first Y capacitor and said second tap of said second set of windings of said balun; and a first X capacitor connected in series with a first resistor, said first X capacitor and said first resistor connected across said balun from said first set of windings to said second set of windings, at the AC voltage input.

11. An AC line filter connected to a ground and having an AC voltage input and an AC voltage output, comprising:

a balun having a first and a second set of windings with said first set of windings and said second set of windings wound on a magnetic core for coupling said first set of windings to said second set of windings, with the first set of windings having a first tap, a first end of said first set of windings connected to a first line of the AC voltage input and a second end of said first set of windings connected to a first line of the AC voltage output, a first end of said second set of windings connected to a second line of the AC voltage input and a second end of said second set of windings connected to a second line of the AC voltage output; and a first Y capacitor connected between said ground and said first tap of said first set of windings of said balun.

12. The AC line filter as set forth in claim 11, further comprising a first X capacitor coupled across said balun from said first set of windings to said second set of windings, at the AC voltage input.

13. The AC line filter as set forth in claim 11, further comprising a second X capacitor coupled across said balun from said first set of windings to said second set of windings, at the AC voltage output.

14. The AC line filter as set forth in claim 11, further comprising a second X capacitor connected in series with a second resistor, said second X capacitor and said second resistor connected across aid balun from said first set of windings to said second set of windings, at the AC voltage output.

15. An Ac line filter connected to a ground and having an AC voltage input and an AC voltage output, comprising:

first Y capacitance means connected to said ground;

second Y capacitance means connected to said ground;

balun means having a first set of windings with a first tap connected to said first Y capacitance means and a second set of windings with a second tap connected to said second Y capacitance means, with said first set of windings and said second set of windings wound on a magnetic core for coupling said first set of windings to said second set of windings, and having a first end of said first set of windings connected to a first line of the AC voltage input and a second end of said first set of windings connected to a first line of the AC voltage output, a first end of said second set of windings connected to a second line of the AC voltage input and a second end of said second set of windings connected to a second line of the AC voltage output, for reducing electromagnetic interference due to common mode noise.

16. An AC line filter connected to a ground and having an AC voltage input and an AC voltage output, comprising:
   first Y capacitance means connected to said ground;
   balun means having a first set of windings with a first tap connected to said first Y capacitance means, a second set of windings wound on a magnetic core with said first set of windings for coupling said first set of windings to said second set of windings, a first end of said first set of windings connected to a first line of the AC voltage input and a second end of said first set of windings connected to a first line of the AC voltage output, a first end of said second set of windings connected to a second line of the AC voltage input and a second end of said second set of windings connected to a second line of the AC voltage output, for reducing electromagnetic interference due to common mode noise.

17. An AC line filter connected to a ground and having an AC voltage input and an AC voltage output, comprising:
   a choke having a first end connected to a first line of the AC voltage input;
   a balun having a first set of windings with a first tap and a second set of windings with a second tap, with said first set of windings and said second set of windings wound on a magnetic core for coupling said first set of windings to said second set of windings, a first end of said first set of windings connected to a second end of said choke and a second end of said first set of windings connected to a first line of the AC voltage output, a first end of said second set of windings connected to a second line of the AC voltage input and a second end of said second set of windings connected to a second line of the AC voltage output;
   a first Y capacitor connected between said ground and said first tap of said first set of windings of said balun; and,
   a second Y capacitor connected between said ground and said second tap of said second set of windings of said balun.

18. The AC line filter as set forth in claim 17, further comprising a first X capacitor coupled across said balun from the first end of said first set of windings to the first end of said second set of windings, at the AC voltage input.

19. The AC line filter as set forth in claim 17, further comprising a second X capacitor coupled across said balun from the second end of said first set of windings to the second end of said second set of windings, at the AC voltage output.

20. The AC line filter as set forth in claim 17, further comprising a second X capacitor connected in series with a second resistor, said second X capacitor and said second resistor connected across said balun from the second end of said first set of windings to the second end of said second set of windings, at the AC voltage output.

21. An AC line filter connected to a ground and having an AC voltage input and an AC voltage output, comprising:
   a choke having a first end connected to a first line of the AC voltage input; a balun having a first set of windings with a first tap, and a second set of windings with a second tap, with said first set of windings and said second set of windings wound on a magnetic core for coupling said first set of windings to said second set of windings, a first end of said first set of windings connected to a second end of said choke and a second end of said first set of windings connected to a first line of the AC voltage output, a first end of said second set of windings connected to a second line of the AC voltage input and a second end of said second set of windings connected to a second line of the AC voltage output;
   a first Y capacitor connected between the first tap of said first set of windings of said balun and said second tap of said second set of windings to said balun; and,
   a second Y capacitor connected between said ground and said second tap of said second set of windings of said balun.

22. The AC line filter as set forth in claim 21, further comprising a second resistor connected between said first Y capacitor and said second tap of said second set of windings of said balun.

23. The AC line filter as set forth in claim 21, further comprising a first X capacitor coupled across said balun from the first end of said first set of windings to said the first end of second set of windings, at the AC voltage input.

24. The AC line filter as set forth in claim 21, further comprising:
   a second resistor connected between said first Y capacitor and said second tap of said second set of windings of said balun; and
   a first X capacitor connected in series with a first resistor across said balun from the first end of said first set of windings to the first end of said second set of windings, at the AC voltage input.

25. The AC line filter as set forth in claim 21, further comprising a first X capacitor connected in series with a first resistor, said first X capacitor and said first resistor connected across said balun from the first end of said first set of windings to the first end of said second set of windings, at the AC voltage input.

26. An AC line filter connected to a ground and having an AC voltage input and an AC voltage output, comprising:
   a choke having a first end connected to a first line of the AC voltage input;
   a balun having a first set of windings with a first tap, and a second set of windings, with said first set of windings and said second set of windings wound on a magnetic core for coupling said first set of windings to said second set of windings, a first end of said first set of windings coupled to a second end of said choke and a second end of said first set of windings connected to a first line of the AC voltage output, a first end of said second set of windings connected to a second line of the AC voltage input and a second end of said second set of windings connected to a second line of the AC voltage output; and a first Y capacitor connected between said ground and said first tap of said first set of windings of said balun.

27. The AC line filter as set forth in claim 26, further comprising a first X capacitor coupled across said balun from said first set of windings to said second set of windings, at the AC voltage input.

28. The AC line filter as set forth in claim 26, further comprising a second X capacitor coupled across said balun from said first set of windings to said second set of windings, at the AC voltage output.

29. The AC line filter as set forth in claim 26, further comprising a second X capacitor connected in series with a second resistor, sand second X capacitor and said second resistor connected across said balun from the first set of windings to the second set of windings, at the AC voltage output.

30. An AC line filter connected to a ground and having an AC voltage input and an AC voltage output, comprising:

first Y capacitance means connected to said ground;
second Y capacitance means connected to said ground; and
balun means having a first set of windings with a first tap connected to said first Y capacitance means, and a second set of windings with a second tap connected to said second Y capacitance means, with said first set of windings and said second set of windings wound on a magnetic core for coupling said first set of windings to said second set of windings, a first end of said first set of windings connected to a first line of the AC voltage input and a second end of said first set of windings connected to a first line of the AC voltage output, a first end of said second set of windings connected to a second line of the AC voltage input and a second end of said second set of windings connected to a second line of the AC voltage output, for reducing electromagnetic interference due to common mode noise.

31. An AC line filter connected to a ground and having an AC voltage input and an AC voltage output, comprising:

first Y capacitance means connected to said ground; and
balun means having a first set of windings with a first tap connected to said first Y capacitance means, and a second set of windings, with said first set of windings and said second set of windings wound on a magnetic core for coupling said first set of windings to said second set of windings, a first end of said first set of windings connected to a first line of the AC voltage input and a second end of said first set of windings connected to a first line of the AC voltage output, a first end of said second set of windings connected to a second line of the AC voltage input and a second end of said second set of windings connected to a second line of the AC voltage output, for reducing electromagnetic interference due to common mode noise.

* * * * *